US005745424A

United States Patent [19]
Furuta et al.

[11] Patent Number: 5,745,424
[45] Date of Patent: Apr. 28, 1998

[54] METHOD FOR TRANSFERRING DATA BIT FOR DRAM

[75] Inventors: Minoru Furuta, Fuksawa; Toshio Sunaga, Kusatsu, both of Japan

[73] Assignee: International Business Machines Corporation, Armonk, N.Y.

[21] Appl. No.: 587,428

[22] Filed: Jan. 17, 1996

[30] Foreign Application Priority Data

Jan. 17, 1995 [JP] Japan .................................. 7-022194

[51] Int. Cl.⁶ .................................................. G11C 7/00
[52] U.S. Cl. ................ 365/233; 365/189.05; 365/233.5; 365/239
[58] Field of Search .................. 365/230.01, 233, 365/189.05, 233.5, 230.03, 239; 395/432

[56] References Cited

U.S. PATENT DOCUMENTS

| | | | |
|---|---|---|---|
| 5,265,218 | 11/1993 | Testa et al. | 395/325 |
| 5,384,745 | 1/1995 | Konishi et al. | 365/230.03 |
| 5,392,239 | 2/1995 | Margulis et al. | 365/189.01 |
| 5,526,320 | 6/1996 | Zagar et al. | 365/233.5 |
| 5,539,696 | 7/1996 | Patel | 365/189 |
| 5,550,784 | 8/1996 | Takai | 365/233 |
| 5,572,468 | 11/1996 | Ishirable et al. | 365/189.05 |
| 5,586,286 | 12/1996 | Santelei et al. | 395/432 |

FOREIGN PATENT DOCUMENTS

| | | | |
|---|---|---|---|
| 0 468 480 A2 | 1/1992 | Japan | G11C 11/409 |
| 0 623 931 A2 | 11/1994 | Japan | G11C 7/00 |

*Primary Examiner*—Viet Q. Nguyen
*Attorney, Agent, or Firm*—Robert A. Walsh

[57] ABSTRACT

A DRAM access system is provided which can maintain high speed as in the burst DRAM, and can perform addressing by burst transfer unit as in the synchronous DRAM, and also have high compatibility with the conventional transfer system.

8 Claims, 6 Drawing Sheets

METHOD FOR TRANSFERRING DATA BIT FOR DRAM

FIELD OF INVENTION

This invention relates generally to dynamic random access memory (DRAM) and in one aspect to provide an access system which can maintain high speed operation in a burst transfer mode. In a more particular aspect, this invention relates to a DRAM which can perform addressing by burst transfer as in a synchronous DRAM, and also have high compatibility with conventional transfer systems.

BACKGROUND ART

A dynamic random access memory (DRAM) has features of a simple structure and small consumed area, but has a problem of low speed. Recently, although MPUs having internal clock as high as 100 MHZ (10 ns in terms of cycle) are not uncommon, the access rate of DRAM cannot catch up with it so that there arises such situation where the capability of MPU is governed by the memory.

An approach to improve the access rate in using the DRAM contemplates utilizing a page mode. The page mode is a system for continuous access by changing column addresses on a row address in the DRAM. Its operation mode is shown in FIG. 1. At the falling edge 11 of a row access strobe (RAS) falls, RA1 which is a row address is latched so that a row (page) to be accessed is determined. At falling edges 12, 13, 14, and 15 of a column access strobe (CAS), CA1, CA2, CA3, and CA4 which are column addresses are latched so that a column to be accessed in RA1 is determined. Then, data 1-4 corresponding to these addresses are output.

According to this system, because several bits of data can be accessed with at least one input of row address, improvement of the rate can be attained. However, since addresses of columns are still input every time, there is limitation in improvement of the rate. That is, the limitation in rate is about 30 ns even in the page mode, which is far behind the speed of an MPU.

There is a hyper page mode as an attempt to improve the transfer rate while maintaining the system. The hyper page mode is a system continuing output of data even after CAS returns to high thereby extending the output time of data. Referring to FIG. 1, data is not output once CAS rises. However, in the hyper page mode, data output time t is continued even after CAS rises. When a DRAM reads data, t is required to continue for a certain duration or more. Here, t' is delay in preparing data output by a DRAM and cannot be shortened without changing DRAM architecture. However, t can be extended by employing the hyper page mode so that the cycle of CAS can be shortened with a circuit comprising the above duration of t. Thus, improvement of the transfer rate can be attained as a whole.

A synchronous DRAM (SDRAM) is recently devised to improve the DRAM access rate. The synchronous DRAM is a DRAM which has a clock input, and latches a read/write command in synchronization with a rising edge of a clock pulse for input/output of data. The operation mode of synchronous DRAM is shown in FIG. 2. The feature of synchronous DRAM lies in provision of a clock (CLK) dedicated for DRAM. Then, the row address RA1 and a command ACT are latched in synchronization with a rising edge 1 of a clock pulse. The command is a command for starting burst transfer of data. Then, a column address CA1 and a command RED (read) are latched in synchronization with a rising edge 2 of clock pulse after two clocks. This would determine an address to be accessed and the mode of access (read or write). Actual data transfer is started two clocks after. This is, burst cycle of data is started at four clocks after the rising edge 1 of clock pulse, and four continuous data are transferred. Since the data transfer is performed every clock rise, its interval consumes four clocks. Because this interval is sufficient time to determine the address to be accessed for the next burst cycle and determine the address to be accessed for the next burst cycle and its mode, it becomes possible to perform continuous burst transfer thereafter. Then, because such system is employed, the synchronous DRAM can increase the speed, and actually ones with about 10 ns cycle have been introduced.

However, because this system needs uniquely to employ a clock for synchronization for outputting data bit, or a mode register for writing various operation modes, its architecture is completely different from that for conventional DRAM so that it becomes expensive and has a problem in compatibility with the conventional DRAM.

Improvement in speed of synchronous DRAM mainly lies in employment of a burst transfer system. The burst transfer is a system where a plurality of data bits is continuously output for one address input. Since the burst transfer is a system which gradually increases the Column address by using a counter in the DRAM for addressing, time for latch input of column address during burst transfer is omitted so that improvement can be expected for speed.

A DRAM access system utilizing only the burst transfer has been recently proposed (burst DRAM or BDRAM). The feature of this system lies in that is uses CAS as if it were a clock pulse as shown in FIG. 3, and continuously transfers data for one page by alternately toggling them. In this system, a row address RA1 is first latched by a falling edge 20 of RAS, and a column address CA1 is latched by a falling edge 22 of CAS, whereby an address to be accessed is determined. Then, once CAS returns high, the first data Dn corresponding to the address is transferred at the next falling edge 23. CAS latency occurs from latching of CA1 to transfer of the first data Dn to take excess time 24, but, from the transfer of next data Dn+1, Dn+2, . . . are transferred in response to falling edges 25, 26, . . . of CAS so that transfer at a very high speed can become possible. In this system, the burst transfer of data is performed as long as CAS toggles. Therefore, this system is suitable in a case where data transfer in the same order should be continuously performed, for example, in a frame memory for graphics.

OE (output enable) in this system is a switch for selecting the burst transfer mode and the normal DRAM mode. That is, when OE is high, it is the burst transfer mode, while, when OE is low, it is the normal DRAM mode. Since OE is high at the falling edge of RAS in FIG. 3, data is transferred in the burst transfer mode.

The advantage of this system is that the transfer is performed at a high speed. However, this burst transfer system has a disadvantage that data can be read only in the order storing on one page of DRAM. This is because the burst system itself specifies the column address by utilizing a counter in the DRAM.

When the DRAM is utilized in connection with the MPU, the burst transfer should be completed in the number of bits corresponding to the transfer bit unit length of the MPU such as 4 bits or 8 bits. Then, after bits in the transfer bit unit length is completed, it is necessary to start the transfer from the bit relating to another column address.

In order to overcome the foregoing problem:

The present invention is intended to provide a DRAM access system which can maintain high speed of an advantage of the burst DRAM, and can perform addressing by burst transfer unit as in the synchronous DRAM.

In addition, the present invention proposed a DRAM transfer system which consumes less current when comparing with the synchronous DRAM, and can attain it without significantly changing the architecture of DRAM as in the synchronous DRAM.

Furthermore, the present invention proposes a DRAM transfer system which can switch the burst transfer mode and the hyper page mode.

SUMMARY OF THE INVENTION

The above objects of the present invention can be attained by a DRAM transfer system at least comprising a first signal line (RAS) for latching an address in a first direction (row address) in synchronization with transition of potential in a DRAM, a second signal line (CAS) for latching an address in a second direction orthogonal to the first direction (column address) in synchronization with transition of potential, and a third signal line (OE) different from the first and second signal lines, wherein a plurality of data bits is continuously burst transferred from data bits relating to the latched row and column addresses by using the change of potential on the third signal line as a start signal. Although the third signal line (OE) conventionally serves as a switch indicating whether or not data can be output, it is used in the present invention as if it were a start signal for burst transfer.

In addition, the burst transfer toggles CAS or RAS to synchronize it with data output as if it were a clock signal. This eliminates necessity to uniquely provide a clock circuit for the DRAM. Here, because the present invention assumes a DRAM used in connection with an MPU, one burst cycle is usually performed in a predetermined number of data bits (for example, four or eight) as one unit.

In addition, the present invention establishes a plurality of operation modes wherein a first mode causes the third signal line OE to act as if it were a start signal for transfer to perform the above-mentioned burst transfer, while a second mode can cause it to act as a switch indicating whether or not data can be output, which is normal action of OE. Thus, as whether or not the burst transfer is performed is secured by change of action of OE, it has very high compatibility with the conventional DRAM transfer system.

DESCRIPTION OF THE PREFERRED EMBODIMENT(S)

Timing charts of the DRAM transfer system according to the present invention are shown in FIGS. 4, 5, 6, and 7.

Figure 4:
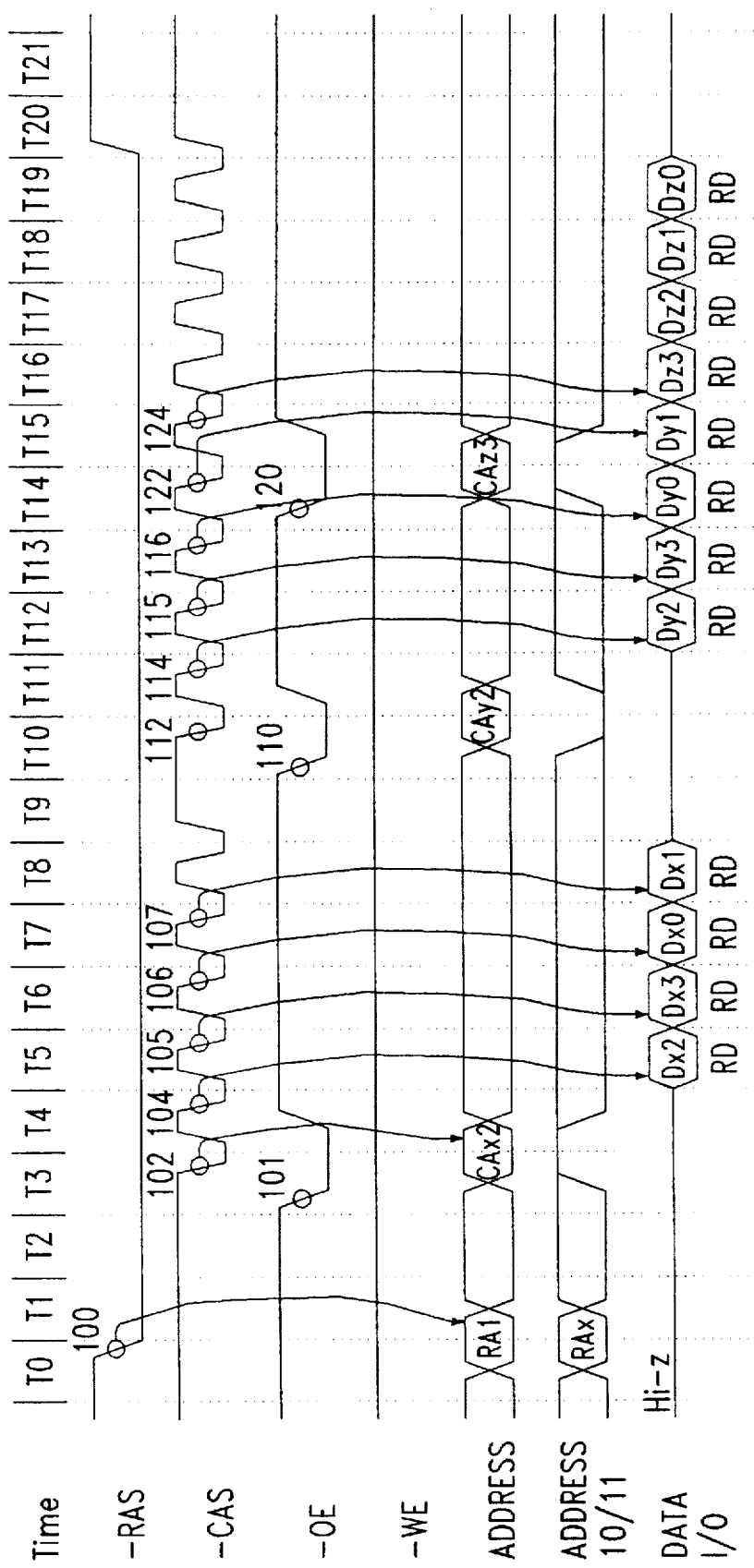
FIG. 4 is a timing chart for read in the burst transfer mode according to the present invention.
Figure 5:
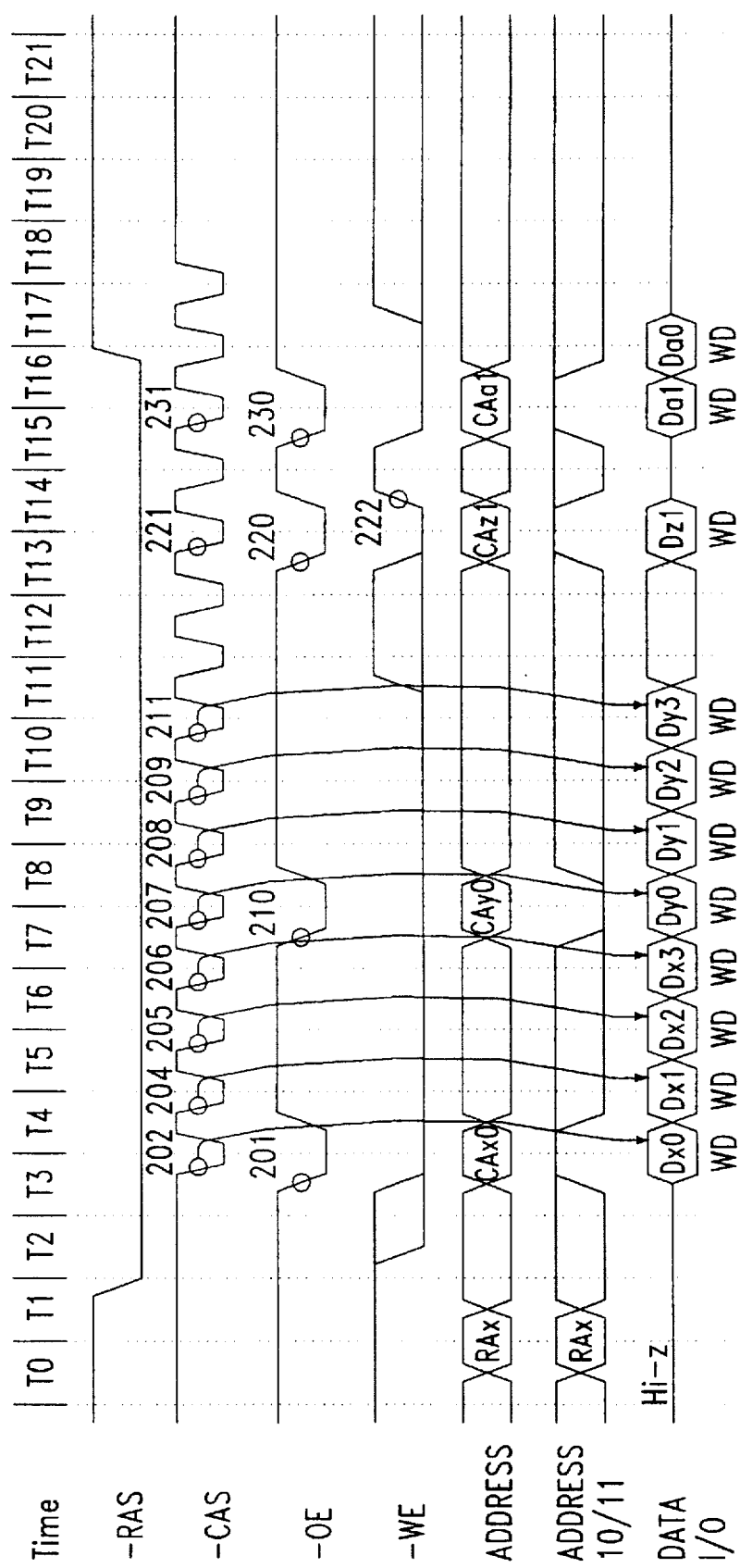
FIG. 5 is a timing chart for write in the burst transfer mode according to the present invention.
Figure 6:
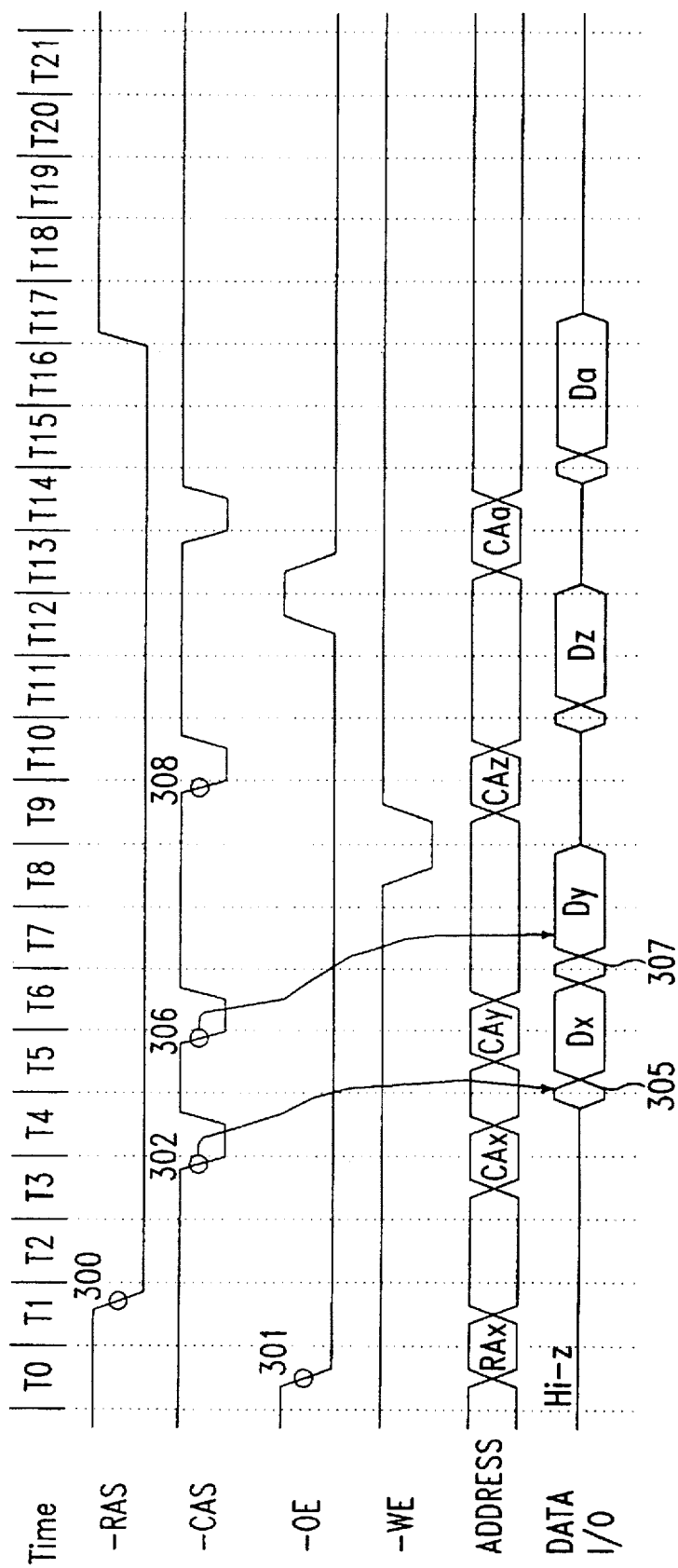
FIG. 6 is a timing chart for read in the hyper page mode according to the present invention.
Figure 7:
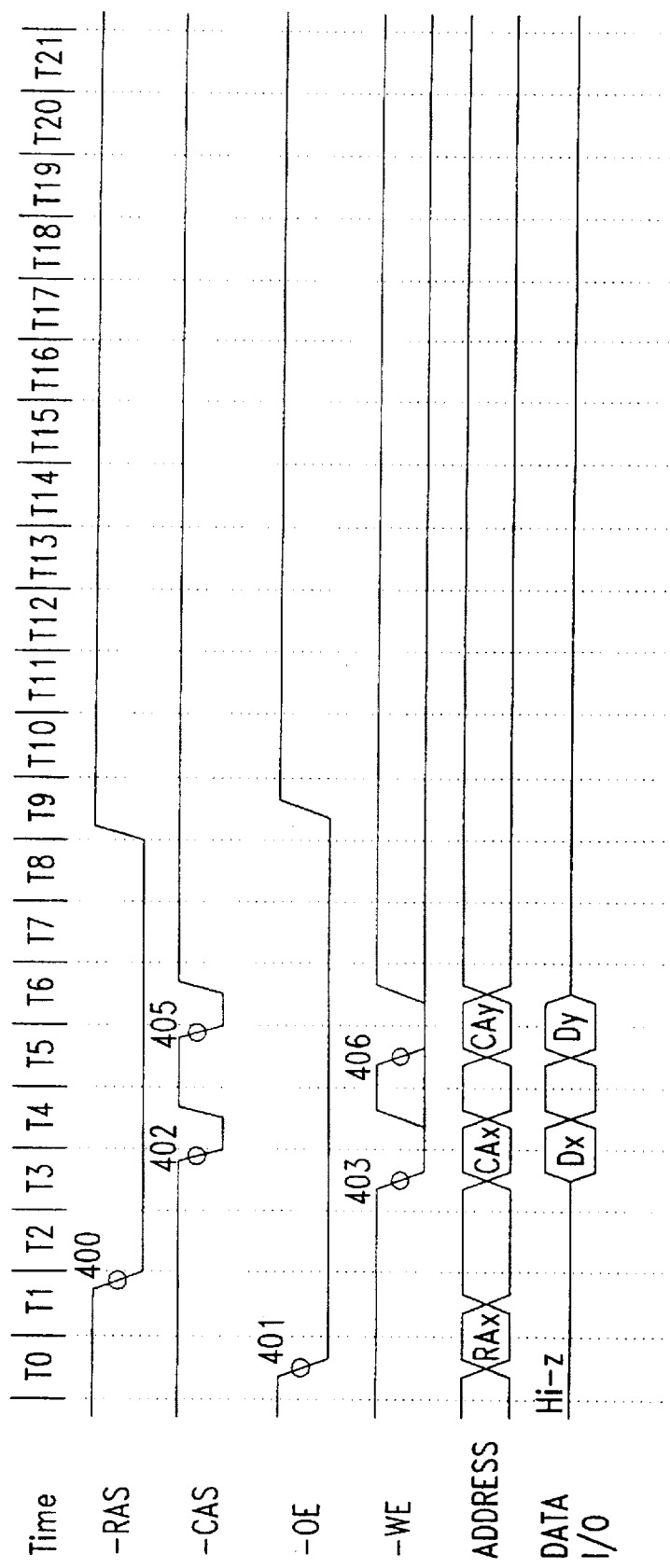
FIG. 7 is a timing chart for write in the hyper page mode according to the present invention.

FIGS. 4 and 5 show the charts in read and write in the burst transfer mode. FIGS. 6 and 7 show the charts in read and write in the hyper page transfer mode. The burst transfer mode and the hyper page transfer mode are identified by the potential on OE at falling edge of RAS. That is, it is defined that, if OE is low at that moment, the mode is the hyper page transfer mode, and, if it is high, the mode is the burst transfer mode. Furthermore, although the lines of RAS, CAS, OE, and WE are reversed for their polarity in the figures and are represented such as –OE by appending "–", "–" is omitted herein. Therefore, expression "OE falls" herein actually means "–OE falls (becomes low) and is enabled."

FIG. 4 shows the operation at read in the burst transfer mode. In the burst transfer mode, OE serves as the start signal for transfer. Here, it serves a role different from the original function of OE where it determines whether or not output can be performed. At time t0, a row address RA1 is latched in response to the falling edge 100 of RAS. At time t3, OE falls (101) to indicate start of the burst transfer. At the falling edge 102 of CAS at the next time t3, a column address CA2 is latched. This determines addresses for row and column so that addressing to bits relating to a particular address is enabled. Actual transfer is performed from the falling edge 104 of CAS at time t4, and data Dx2 is read. In reading, it should be noted that actual reading of data is performed one clock later after the falling edge of CAS. The fact that the burst transfer is performed by using CAS as a clock pulse is same as in the burst DRAM. That is, at time t5–t7, data Dx3, Dx4, and Dx5 are sequentially read in response to falling edges of CAS. Since the burst transfer unit is four bits in the burst transfer mode, the transfer is automatically completed at time t9 after four continuous data are read. Thus, as the present invention performs the burst transfer by utilizing CAS as if it were a clock signal, there is no change in architecture by uniquely providing a clock on the DRAM as in the synchronous DRAM.

It is a major feature of the present invention that OE is used as the start signal of burst transfer. That is, start of the burst transfer is determined by specifying a column address with the falling edge 101 of OE at a point of time and the first falling edge of CAS thereafter. Even if such condition is satisfied, the burst transfer is not started until read by the previous burst transfer is completed. That is, once the burst transfer is started, four continuous data would be surely read.

By controlling the timing of falling of OE, data can be continuously transferred as in the burst DRAM. This is indicated at time t10–t20. When OE falls at time t10 (110), and, then, CAS also falls at time t10 (112), the condition for starting the burst transfer is satisfied. Then, a column address Cay2 is latched by the falling edge 112 of CAS to determine the access address. The burst transfer of data is actually started at the falling edge 114 of CAS at time t11 to latch data Dy2. Then, data Dy3, Dy0, and Dy1 are latched by the falling edges 115, 116, and 122 of CAS at time t12–t14.

Here, a falling edge 120 of OE appears again at t14. The, the falling edge of OE is combined with the falling edge 122 of following CAS to serve as a start signal for starting the burst transfer. In addition, the falling edge 122 of CAS also serves to latch the next column address CAz3. This burst transfers four data from data Dz3 and thereafter from time t16–t19 in response to a falling edge 124 of CAS at t15 as in the previous burst cycle. Here, because falling edge 120 of OE is attained at t14, the burst transfer continues the previous burst cycle. That is, there is no consumption of excess clock cycles between the last data Dy1 in the previous burst cycle and data Dz3 of the following burst cycle.

Thus, in the present invention, by controlling timing of a falling edge of OE, the burst transfer within a same page can be continuously performed while changing column addresses. To freely change column addresses during continuous burst transfer as above cannot be attained in the conventional burst DRAM.

Next FIG. 5 shows the write operation in the burst transfer mode. RAS falls at time t1 so that a row address RAx is read. Then, a falling edge 201 of OE at time t3 followed by the falling edge 202 of CAS causes the burst transfer to start at the same time as reading. The falling edge 202 of CAS latches a column address CAx0, which determines an address to be read on DRAM is determined so that data Dx0 is simultaneously written at falling time t3 of CAS. Although, in reading, the data transfer is performed at one clock later than the failed edge of CAS, in writing, it differs in that the data transfer completes in the same clock cycle. Thus, when the burst transfer mode is started, data Dx1, Dx2, and Dx3 are sequentially written at the falling edges 204, 205, and 206 of CAS, respectively.

In FIG. 5, after the burst transfer cycles (Dx0, Dx1, Dx2, and Dx3) complete, the following burst transfer cycles Dy0, Dy1, Dy2, and Dy3 are started without interposing a clock cycle. It is because starting of a new burst cycle is recognized as a falling edge 207 of CAS occurs at time t7 following the falling edge 210 of OE. Then, similarly, as a column address CAy0 is latched at the falling age 207 of CAS, the data Dy0 is written in the same clock cycle by the falling edge 207 of CAS. Thereafter, same is applied to writing of data Dy1, Dy2, and Dy3 by the falling edges 208, 209, and 211 of CAS.

In addition, WE at low in FIG. 5 indicates the write mode. Accordingly, as the interval from t3 to t11 is in the write mode, data Dxn, . . . , Dyn (n=0–3) are written at such time. Writing may be interrupted by utilizing the WE without the burst transfer. For example, a column address CAz1 is latched at time t13 by a falling edge 221 of CAS following a falling edge 220 of OE, and starting of the burst transfer is attempted. Consequently, data Dz1 is written at t13 in the same clock cycle. However, as writing is inhibited by a rising edge 222 of WE at the following clock cycle t14, writing is not performed by the burst transfer thereafter. Thus, only the first data Dz1 of four data in the burst transfer cycle is written.

A column address can be changed without ending the burst transfer cycle by utilizing the above. A new burst transfer cycle is started at t15 thereafter by falling OE (230), and, then, falling CAS (231). A new column address CAa1 is latched in this case so that writing of data Da1 into the new address becomes possible.

As described above, it is one of features of the present invention that a falling edge of OE is utilized as a signal for starting the burst transfer. Although OE has been used originally as a switch for indicating whether or not output can be performed, a new feature of the present invention is to use it as if it were a start signal. In addition, although it is desirable that falling of OE and falling of CAS occur in the same cycle from the viewpoint of response speed, it is not necessarily as essential requirement. It is sufficient that a column address can be determined by falling of CAS following falling of OE. In addition, although the embodiment constitutes a signal for starting the burst transfer by combining OE and CAS, it would be obvious to those skilled in the art that combination of OE and RAS is equivalent.

Thus, it becomes possible in the present invention to change column addresses every time one burst transfer cycle completes. In addition, change of column address becomes possible even during a burst transfer cycle by utilizing WE. This is significant difference from the conventional burst DRAM. Furthermore, because the present invention toggles CAS to use it as if it were a clock signal for the burst transfer, there is no necessity to provide a unique clock circuit for the DRAM as in the synchronous DRAM.

Figure 1:
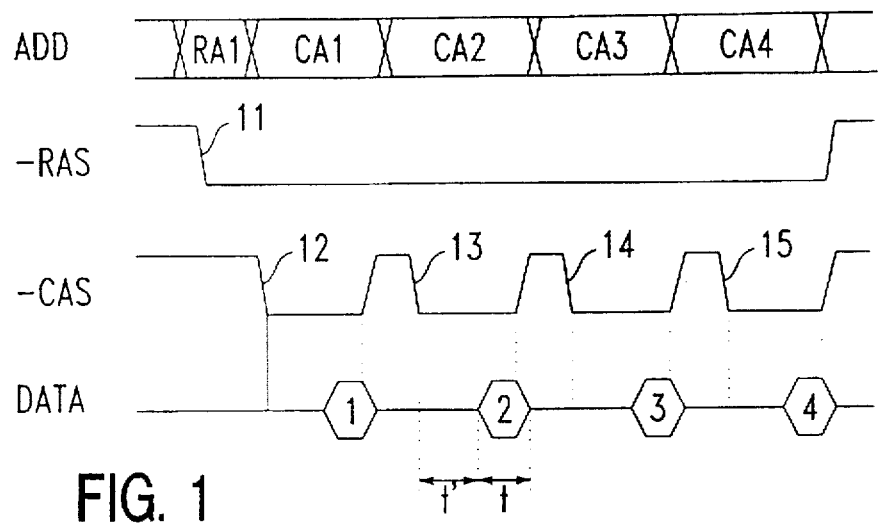
FIG. 1 is a timing chart for a page transfer mode of the prior art.
Figure 2:
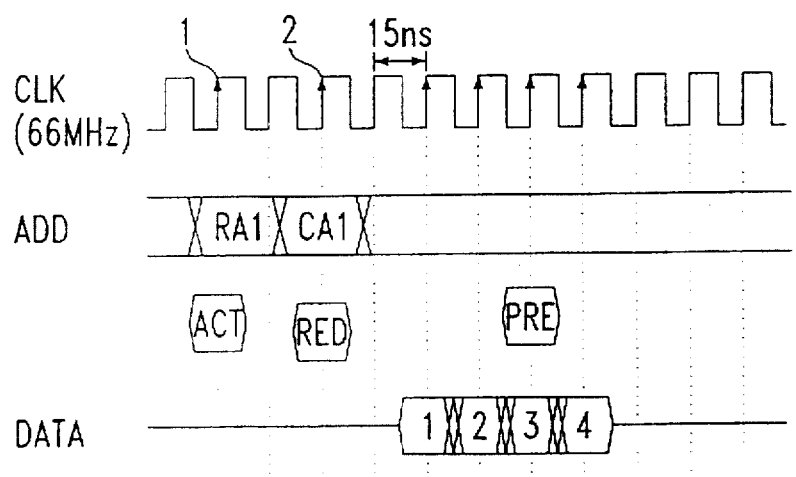
FIG. 2 is a timing chart for a synchronous DRAM of the prior art.
Figure 8:
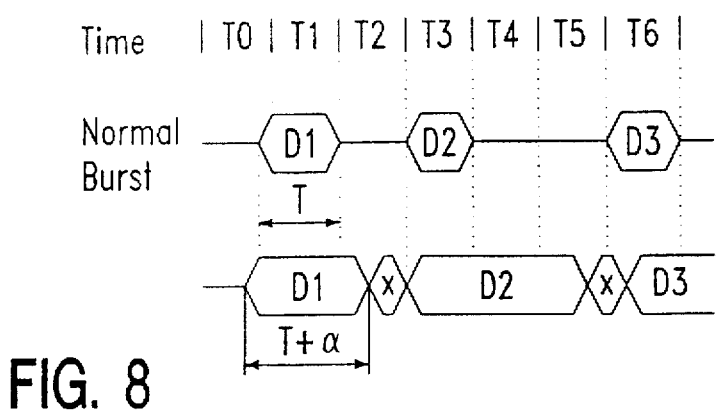
FIG. 8 is a diagram generally illustrating the hyper page mode in the prior art.
Figure 3:
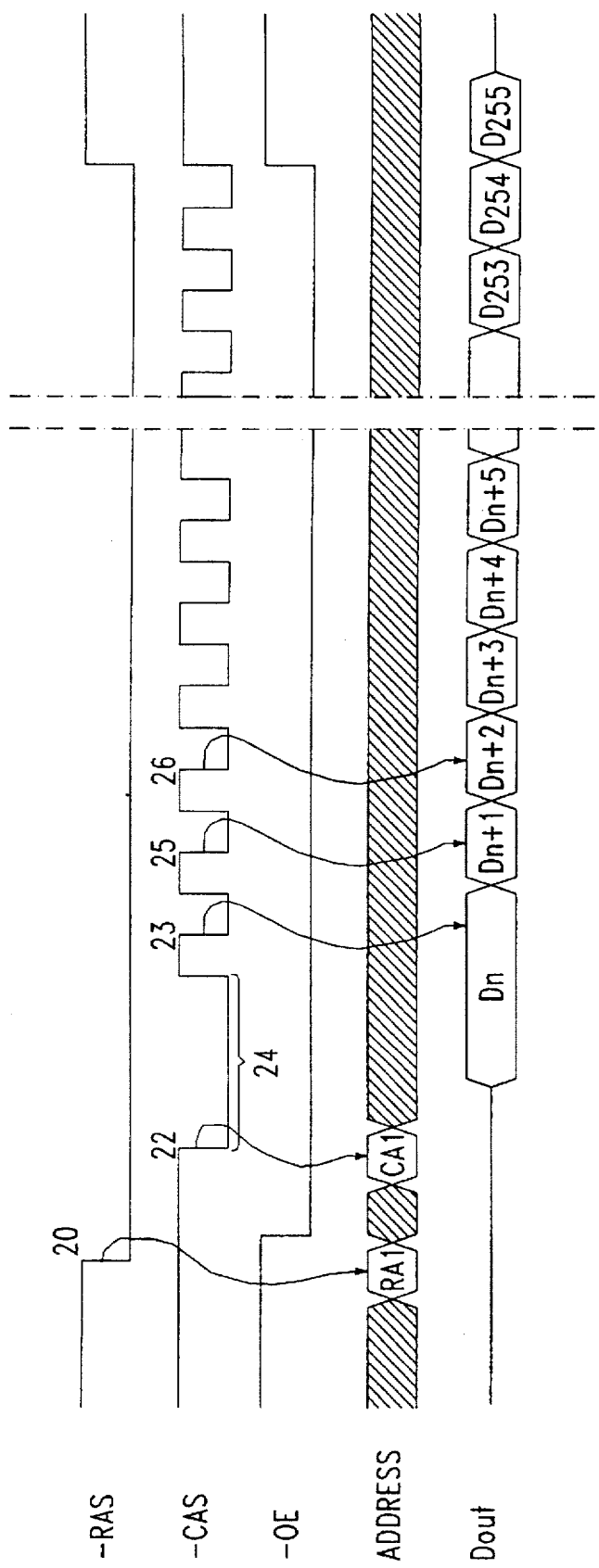
FIG. 3 is a timing chart for a burst DRAM of the prior art.

Next, it is indicated that the system of the present invention is compatible with the hyper page mode. Switching from the burst transfer mode to the hyper page transfer mode is performed by the potential level of OE when RAS falls. The hyper page transfer mode is a mode where data output time is extended than the prior art by continuing output of data even while the potential of CAS is high to shorten the cycle time. FIG. 8 shows the comparison between the hyper page mode and the normal mode. In the normal mode (including the burst transfer mode), the data output continues only for one clock cycle, while, in the hyper page mode, the data output is extended to the next clock cycle. For example, in the hyper page mode, data D1 at time t1 which is output only in one clock in the normal mode is continued until the next falling edge of CAS (time t+α), and then the next data is output. One output following data d2 at time t3 is data D3 at time t6, and output of D2 continues just before expiration of time t5 and moves to output of D3.

FIGS. 6 and 7 show an example implementing such hyper page mode by using the present invention. FIG. 6 shows the read operation by the hyper page mode, while FIG. 7 shows the write operation.

Referring to FIG. 6, OE falls at t0 (301) enabling output of data. In this mode, OE performs the normal output enable function. RAS falls at t0 (400), thereby a row address RAx being latched. Then, CAS falls at time t3 (302), thereby a column address CAx being latched. Thus, data Dx is output. The next data Dy is output from time t7, and, until the data Dx remains to be output. The data Dy is the data of column address Cay latched by the falling edge 306 of CAS at time t5. Output of the data Dy continues until time t8, and terminates. This is because WE turns to low at time t8. The next output of data is output of data Dz by the fact that a column address CAz is taken in at the falling edge 308 of CAS. Its output continues only for time t11 and t12 because OE turns to high at time t12.

Thus, it is the feature of the present invention that, in the hyper mode, OE performs its original output enable function and does not have the function as the start signal as in the burst transfer mode.

FIG. 7 is the write operation in the hyper page mode. In write, the hyper page mode is same as the normal mode. In this case also, OE only has the function of switch for output enable. That is, OE falls at time t0 (401) and turns to low whereby output of data is enabled, while a row address RAx is latched at a falling edge 400 of RAS. In addition, CAS falls at time t3 (402) whereby the column address CAx is latched. As WE falls (403) to be the write mode, write is enabled so that data Dx is written. This data output only continues for one clock cycle because WE rises at time t4 to not be the write mode. Since, in the write mode, existing data is only written, it is not necessary to extend the output time of data. Assuming that OE continues to be low, writing of data Dy is performed by latching the column address CAy with the falling edge 405 of CAS at t5, and transition to the write mode at the falling edge 406 of WE.

As described above, according to the present invention, in switching between the hyper page mode and the burst transfer mode, there is an advantage that the function of OE is also switched to that these two modes can coexist. The present invention does not employ an element different from the conventional architecture such as a clock in the synchronous DRAM, but switches the hyper page mode and the burst transfer mode only by changing the function of OE. Accordingly, it is possible to maintain very high compatibility for conventional various operation modes. Although the embodiment has been described for the compatibility with the hyper page mode, essence of the present invention lies in that the function of OE varies according to operation modes. Therefore, it is not necessarily to have the hyper page characteristics in a mode other than the burst transfer mode.

As described above, the present invention starts the burst transfer by utilizing a conventional existing signal line, OE, so that high speed transfer can be attained, and its start address can be set for every burst transfer cycle with no loss in time.

In addition, since the burst transfer mode toggles and uses CAS as if it were a clock signal to transfer data, there is no need to provide a unique clock signal circuit in the DRAM. Thus, the present invention has technical advantages of high compatibility with the conventional transfer system and low power consumption, and is advantageous in cost.

In addition, since OE can serve the conventional function, conventional operation modes such as the hyper page mode can be supported.

Accordingly, the preferred embodiment of the operation of high speed transfer of data from DRAM has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

We claim:

1. A DRAM transfer system comprising:

a first signal line for latching an address in a row direction in synchronization with transition of its signal level;

a second signal line for latching an address in a column direction in synchronization with transition of its signal level; and a third signal line (OE) in which a function is changed according to the change of operation mode, said third signal line has a function to start the burst transfer from said latched address in said row direction and a data bit relating to said latched address in said column direction when changes of signal level is detected in a first operation mode, and a function to enable output of said data bit only when the signal level is at either high or low predetermined level in a second operation mode.

2. A DRAM transfer system according to claim 1, wherein said second mode outputs data for a duration of one clock cycle or more.

3. A DRAM transfer system according to claim 1, wherein said burst transfer transfers respective data bits in synchronization with alternating high and low transition of the signal level on either one of said first signal line or said second signal line.

4. A DRAM transfer system according to claim 1, wherein said burst transfer makes a predetermined number of data bits a unit.

5. A DRAM transfer system according to claim 4, which includes a fourth signal line wherein a change of signal level on said fourth signal line will stop the burst transfer.

6. A DRAM transfer system according to claim 5 wherein the first signal line is a row access strobe (RAS), the second signal line is a column access strobe (CAS), the third signal line is an output enable (OE), and the fourth signal line is a write enable (WE).

7. A DRAM transfer system according to claim 3 wherein the burst transfer occurs when the third signal line toggles the first or second signal line to synchronize the data output as if it were a clock signal thereby eliminating the need for a separate clock circuit for the DRAM.

8. The DRAM transfer system according to claim 3 wherein the third signal line is an output enable (OE) whose change in signal level is a start signal for the burst transfers.

* * * * *